United States Patent [19]

Fugere et al.

[11] Patent Number: 5,666,076
[45] Date of Patent: Sep. 9, 1997

[54] NEGATIVE INPUT VOLTAGE COMPARATOR

[75] Inventors: Robert H. Fugere, North Providence; James Alvernaz, West Greenwich, both of R.I.

[73] Assignee: Cherry Semiconductor Corporation, East Greenwich, R.I.

[21] Appl. No.: 655,871

[22] Filed: May 8, 1996

Related U.S. Application Data

[60] Provisional application No. 60/004,640, Sep. 29, 1995.
[51] Int. Cl.$^6$ ................................................. H03K 5/22
[52] U.S. Cl. .................................... 327/77; 327/66
[58] Field of Search ............................ 327/65, 66, 77, 327/88, 89, 103, 478, 480; 323/315, 316, 317

[56] References Cited

U.S. PATENT DOCUMENTS

| | | | |
|---|---|---|---|
| 3,735,149 | 5/1973 | Tuchiya | 327/478 |
| 4,527,076 | 7/1985 | Matsuo et al. | 327/88 |
| 5,319,265 | 6/1994 | Lim | 327/77 |
| 5,420,530 | 5/1995 | Mita | 327/77 |
| 5,451,891 | 9/1995 | Tanabe | 327/89 |

*Primary Examiner*—Toan Tran
*Attorney, Agent, or Firm*—Bromberg & Sunstein LLP

[57] ABSTRACT

A negative input voltage comparator that compares a negative input voltage signal against a positive voltage signal in a circuit, such as an integrated circuit. The negative input voltage signal is effectively isolated from the circuit by means of a series resistor in the base-emitter circuit of a transistor which is connected in the output leg of a current comparator.

14 Claims, 1 Drawing Sheet

NEGATIVE INPUT VOLTAGE COMPARATOR

BACKGROUND OF THE INVENTION

The present application claims priority from U.S. provisional application Ser. No. 60/004,640, filed Sep. 29, 1995.

The present invention relates to a comparator circuit for comparing a negative input voltage signal with a positive input voltage signal.

Generally, negative voltages may not be applied to integrated circuits which have single positive voltage power supplies because parasitic diode elements of the integrated circuitry may not have negative potentials applied to them with respect to the substrate of the integrated circuit. Reverse biasing of these circuit elements would lead to latch-up and ultimately to the failure of the integrated circuit.

When a circuit application requires the comparison of a negative signal voltage against a threshold level set by a positive reference, implementation of a comparator circuit on a single integrated circuit has necessitated bipolar power supplies with positive and negative supply voltages applied to the integrated circuit. In this manner, it can be ensured that no point in the circuitry is more negative than the substrate of the integrated circuit. This solution entails the expense and complexity of a dual voltage power supply.

An alternative method of comparing negative voltage signals with a positive reference voltage requires the inversion of the negative voltage signal with respect to ground by using components external to the integrated circuit. Again, a penalty is incurred in circuit complexity.

SUMMARY OF THE INVENTION

In accordance with one formulation of the present invention, a comparator circuit is provided which compares a negative input voltage signal against a positive voltage signal. The positive voltage signal is applied to the base of a first transistor. The emitter of the first transistor is grounded via a first resistor, and the emitter terminal supplies current to the input circuit of a current mirror. The output current of the current mirror is either sunk through a second transistor or directed out from an output node, depending on the relative voltages of the positive and negative input signals. When the negative input signal, applied through a series resistor in the base-emitter circuit of the second transistor, goes sufficiently negative, as determined by the level of the positive input signal and the ratio of the resistances of the first and second series resistors, the output current of the current mirror is substantially all sunk through the second transistor. As the negative input signal rises, becoming less negative, current is allowed to flow out from the output node. A transistor switch may be provided with the base connected to the output node for producing a high or low signal, depending upon the voltage comparison.

The circuit of the present invention modifies the conventional comparator circuit by providing a path to ground for a negative voltage signal applied to the comparator chip, that path including the emitter-base circuit of a bipolar transistor and a series resistor. The series resistor serves, effectively, to isolate the integrated circuit from negative voltages.

The comparator circuit described herein advantageously provides the capability to compare a negative voltage input signal with a positive voltage input signal using circuitry fully contained in an integrated circuit in which a single supply voltage is sufficient. An additional advantage of the present invention is to provide a negative input voltage comparator which isolates the integrated circuit from negative voltages. The circuit of the present invention further advantageously provides a novel negative input voltage comparator which is of relatively simple and inexpensive construction. Other objects and advantages of the invention are in part apparent and in part pointed out hereinafter.

DETAILED DESCRIPTION OF THE PREFERRED EMBODIMENTS

Figure 1:
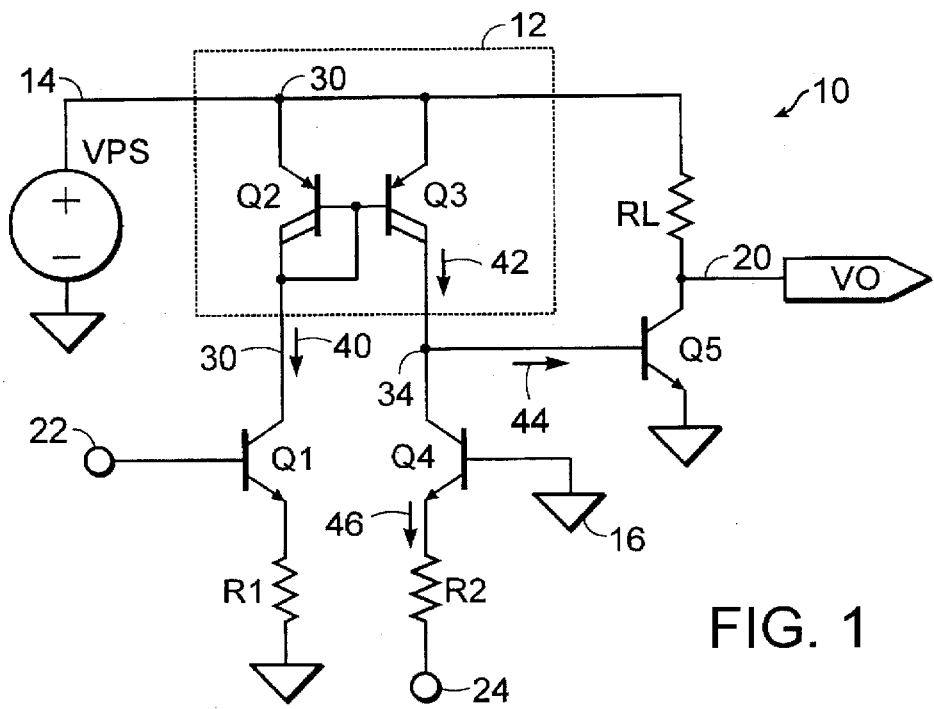
FIG. 1 is a circuit diagram of a negative input voltage comparator constructed in accordance with the present invention.

Referring now to FIG. 1, the negative input voltage comparator is indicated generally by reference character 10. In the preferred embodiment, negative voltage input comparator 10 is implemented as a portion or entirety of an integrated circuit (not shown), and provides first and second transistors, Q1 and Q4, and a current mirror 12, interconnected as hereinafter described. In the preferred embodiment, power is received by a supply line 14 at a positive potential with respect to a ground 16. It is to be understood that electrical polarities are given as conventionally practiced in the art, but that reversal of polarities is within the scope of the invention, to include the substitution of pnp bipolar transistors for npn bipolar transistors, wherever necessary, as is known in the art.

Negative voltage input comparator 10 provides a voltage at a switched output 20 which is in one of two states. Switched output 20 is either in a 'high' state, in which case the voltage potential at switched output 20 is at substantially the potential of supply line 14, or else switched output 20 is in a 'low' state, where the voltage potential at switched output 20 is substantially lower than the potential of supply line 14. The state of switched output 20 is determined by the relative voltages applied at a first input port 22 and at a second input port 24. In particular, the voltage applied at first input port 22 is positive while the voltage applied at second input port 24 is negative.

The operation of negative input voltage comparator 10 which provides for the dependence of the state of switched output 20 on voltages at first input port 22 and second input port 24 will now be described. Current mirror 12 is a conventional three-port circuit element which provides a common-emitter port 30 and two collector terminals 32 and 34. While current mirror 12 can be realized in other ways, current mirror 12 is typically realized by two transistors Q2 and Q3 which share emitters and bases, ensuring the proportionality of current flowing between respective emitters and collectors of Q2 and Q3. The collector current of input transistor Q2 is thus mirrored by the collector current of output transistor Q3.

Common-emitter port 30 of current mirror 12 is connected to supply line 14. An input current 40 of current mirror 12 flows through terminal 32 and an output current 42 of current mirror flows through terminal 34. Terminal 32 is connected to the collector of first transistor Q4, while terminal 34 is connected to the collector of second transistor Q4. Input current 40 of current mirror 12 flows to ground through the emitter of transistor Q1 and through a first resistor R1 connected in series between the emitter of Q1 and ground 16. The magnitude of input current 40 is determined by the positive signal at input port 22 at the base of first transistor Q1, the base-emitter voltage of transistor Q1, and by the resistance of first resistor R1. The voltage at input port 22 may be supplied externally or may also be a reference voltage derived on the integrated circuit in which negative input voltage comparator 10 is embedded.

Output current 42, which, by operation of current mirror 12, is proportional in magnitude to input current 40, can flow to ground through the base-emitter junction of transistor switch Q5. Alternatively, output current 42 will be sunk to ground via second transistor Q4 when a negative signal voltage at second input port 24 causes current to flow through series resistor R2 connected in series between the emitter of second transistor Q4 and second input port 24. Current mirror 12 in conjunction with its associated input and output circuits thus operate as a current comparator, with first transistor Q1 constituting a first leg and second transistor Q4 constituting a second leg.

Since the base of second transistor Q4 is grounded, the entire negative voltage at second input port 24 is dropped across resistor R2, except for a typical −0.6 volts across the base-emitter junction of second transistor Q4. Thus, negative voltages are blocked from appearing elsewhere in the circuit of negative voltage comparator 10. This allows negative voltage comparator 10 to be supplied by a single positive voltage source (not shown) at supply line 14.

As is apparent by the foregoing description, a base current 44 will flow in transistor switch Q5 unless current 46 through resistor R2 exceeds input current 40 of current mirror 12 which flows through resistor R1. When base current flows in transistor switch Q5, transistor switch Q5 conducts, and switched output 20, connected between the collector of transistor Q5 and load resistor RL in series with supply line 14, is brought to a low voltage, namely the saturation voltage of transistor switch Q5. In the other circumstance, if no base current flows in transistor switch Q5, as occurs when second signal input 24 goes more negative than a value specified by the voltage at first signal input 22 and the respective resistances of first resistor R1 and series resistor R2, switched output 20 is brought to a voltage substantially that of supply line 14.

The assumption made in describing the operation of negative voltage input comparator 10 is that any succeeding circuit (not shown) presents a high impedance and itself draws negligible current through load resistor RL. The effect of a finite load impedance will be for some voltage to be dropped across resistor RL in the high state.

Figure 2:
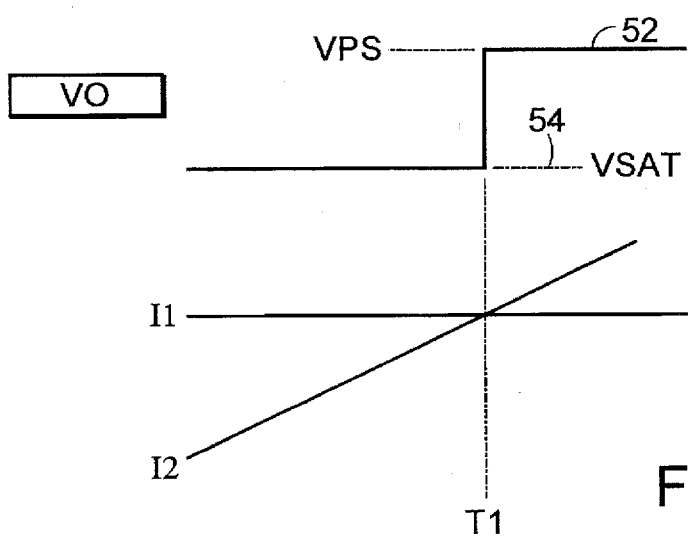
FIG. 2 is an illustration of voltage levels characterizing the operation of the present invention.

The operation of negative voltage input comparator 10 is now described with reference to FIG. 2. Switched output voltage V0 is always in one of two states: a 'high' state 52 or a 'low' state 54. In high state 52, switched output voltage V0 is substantially at positive supply voltage VPS of supply line 14. In low state 54, switched output voltage V0 is brought down to saturation voltage VSAT of the base-collector junction of transistor Q5. The conditions causing switched output voltage V0 are shown with reference to current I1 which flows through first resistor R1 and current I2 which flows through series resistor R2. For the case where current mirror 12 mirrors an output current equal to its input current, transition T1 of output voltage V0 from low state 54 to high state 52 occurs when current I2 becomes greater than current I1. Other implementations of current mirror 12 having proportionalities of input current to output current different from unity will cause transition T1 to occur at corresponding ratios of currents I1 and I2. The voltages at first input port 22 and second input port 24 which cause current I2 to become greater than current I1 and thus cause output voltage V0 to switch states are readily designed through choice of resistors R1 and R2, as is known in the art.

The described embodiments of the inventions are intended to be merely exemplary and numerous variations and modifications will be apparent to those skilled in the art. All such variations and modifications are intended to be within the scope of the present invention as defined in the appended claims.

We claim:

1. A negative input voltage comparator comprising:
   a supply means for receiving a power supply voltage;
   a current comparator connected to said supply means and having a first leg and a second leg;
   means for establishing an input current in the first leg of said current comparator using a positive voltage;
   a first resistor connected to an end of the second leg of said current comparator;
   an input port coupled to said first resistor opposite from the second leg of said current comparator to receive said negative input voltage; and
   an output node located on the second leg of said current comparator such that output current flows out from said output unless an amount of current through the first resistor is at least as large as the input current multiplied by a predetermined factor.

2. The negative input voltage comparator as set forth in claim 1 wherein said current comparator comprises:
   a current mirror;
   a first transistor, in the first leg, having a collector connected to said current mirror, an emitter connected to ground through a second resistor, and a base connected to said positive voltage;
   a second transistor, in the second leg, having a collector connected to said current mirror, a grounded base, and an emitter connected to said negative voltage through said first resistor.

3. The negative input voltage comparator as set forth in claim 2 wherein said means for establishing an input current in the first leg of said current comparator applies said positive voltage to the base of said first transistor.

4. The negative input voltage comparator as set forth in claim 1 wherein said predetermined factor is unity.

5. The negative input voltage comparator as set forth in claim 1 further comprising a transistor switch having a base coupled to said output node, an emitter connected to ground, and a collector that provides a switched output.

6. A negative input voltage comparator comprising:
   a supply means for receiving a supply voltage;
   a current mirror, coupled to said supply means, having an input current and an output current;
   a means, including a first input node, for establishing the input current in said current mirror;
   a transistor having a collector for receiving said output current of said current mirror, having a base connected to ground and having an emitter;
   an output node at the collector of said transistor; and
   a resistor coupled between the emitter of said transistor and a second input node of said comparator,
   wherein a negative voltage applied to said second input node is compared to a positive voltage applied to said first input node to selectively sink the output current of said current mirror to ground through said transistor.

7. The negative input voltage comparator as set forth in claim 6 wherein said means for establishing the input current comprises an input transistor having a base connected to the first input node, a collector connected to said current mirror for conducting the input current, and an emitter.

8. The negative input voltage comparator as set forth in claim 7 wherein said means for establishing the input current further comprises a resistor coupled between the emitter of said input transistor and ground.

9. The negative input voltage comparator as set forth in claim 6 further comprising a transistor switch having a base connected to said output node, a grounded emitter, and a collector that provides a switched output.

10. The negative input voltage comparator as set forth in claim 9 further comprising a load resistor connected between the switched output at the collector of said transistor switch and said supply means.

11. The negative input voltage comparator as set forth in claim 6 wherein the positive voltage applied to the first input node is a fixed reference.

12. A negative input voltage comparator comprising:

a supply means for receiving a supply voltage;

first and second input nodes;

a current mirror coupled to said supply means and having an input current and an output current;

a first transistor having a base connected to said first input node and a collector connected to said current mirror for conducting the input current of said current mirror;

a first resistor coupled between the emitter of said first transistor and ground;

a second transistor having a collector for receiving said output current of said current mirror, having a base connected to ground and having an emitter;

a second resistor coupled between the emitter of said second transistor and said second input node; and a transistor switch having a base connected to the collector of said second transistor, a grounded emitter, and a collector that provides the switched output, wherein the switched output goes to a high voltage state when a negative voltage applied to said second input node has an absolute value greater than a positive voltage applied to the first input node multiplied by a predetermined factor.

13. The negative input voltage comparator as set forth in claim 12 further comprising a load resistor connected between said supply means and the collector of said transistor switch.

14. The negative input voltage comparator as set forth in claim 12 wherein the predetermined factor is a function of said first and second resistors.

* * * * *